(12) United States Patent
Amey et al.

(10) Patent No.: US 7,902,662 B2
(45) Date of Patent: Mar. 8, 2011

(54) POWER CORE DEVICES AND METHODS OF MAKING THEREOF

(75) Inventors: Daniel I. Amey, Durham, NC (US);
William Borland, Chapel Hill, NC (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 892 days.

(21) Appl. No.: 11/732,174

(22) Filed: Apr. 2, 2007

(65) Prior Publication Data

US 2008/0236877 A1    Oct. 2, 2008

(51) Int. Cl.
*H01L 23/538* (2006.01)

(52) U.S. Cl. ..... 257/700; 257/691; 257/781; 257/E23.03; 257/E23.012; 257/E23.079; 257/E23.142; 257/E23.144

(58) Field of Classification Search .......... 257/691, 257/700, 781
See application file for complete search history.

(56) References Cited

U.S. PATENT DOCUMENTS

| | | | |
|---|---|---|---|
| 5,161,086 A | 11/1992 | Howard et al. | |
| 5,635,767 A * | 6/1997 | Wenzel et al. | 257/778 |
| 5,854,534 A * | 12/1998 | Beilin et al. | 257/691 |
| 6,102,710 A * | 8/2000 | Beilin et al. | 439/67 |
| 6,239,485 B1 * | 5/2001 | Peters et al. | 257/700 |
| 6,346,743 B1 | 2/2002 | Figueroa et al. | |
| 6,388,207 B1 | 5/2002 | Figueroa et al. | |
| 6,512,680 B2 * | 1/2003 | Harada et al. | 361/777 |
| 6,611,419 B1 | 8/2003 | Chakravorty | |
| 7,613,007 B2 | 11/2009 | Amey, Jr. et al. | |
| 7,701,052 B2 * | 4/2010 | Borland et al. | 257/700 |
| 2002/0085334 A1 | 7/2002 | Figueroa et al. | |
| 2005/0035754 A1 * | 2/2005 | Ho et al. | 324/158.1 |
| 2006/0133057 A1 | 6/2006 | McGregor et al. | |
| 2006/0138591 A1 * | 6/2006 | Amey et al. | 257/532 |
| 2007/0090511 A1 | 4/2007 | Borland et al. | |

FOREIGN PATENT DOCUMENTS

EP          1675449 A       6/2006

OTHER PUBLICATIONS

Richardson et al., "The Thermodynamics of Substances of Interest in Iron and Steel Making from 0 C to 2400 C", Journal of the Iron and Steel Institute, 1948, pp. 261-270.

* cited by examiner

*Primary Examiner* — Leonardo Andújar
*Assistant Examiner* — William Harriston

(57) ABSTRACT

A device comprising a power core wherein said power core comprises: at least one embedded singulated capacitor wherein said embedded singulated capacitor comprises at least a first electrode and a second electrode and wherein said embedded singulated capacitor is positioned on the outer layer of the power core so that at least one Vcc (power) terminal and at least one Vss (ground) terminal of a semiconductor device can be directly connected to at least one first and at least one second electrode, respectively and wherein the first and second electrode of the singulated capacitor is interconnected to the first and second electrode respectively of an external planar capacitor embedded within a printed wiring motherboard.

6 Claims, 12 Drawing Sheets

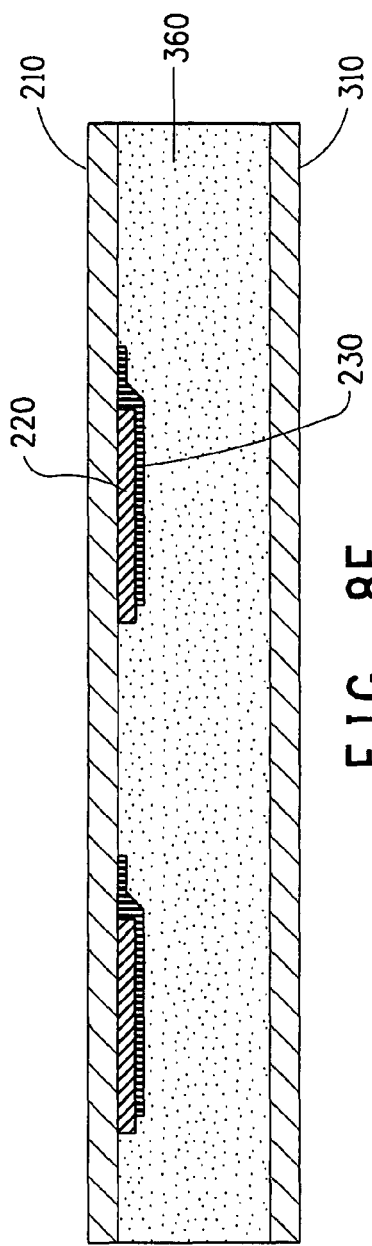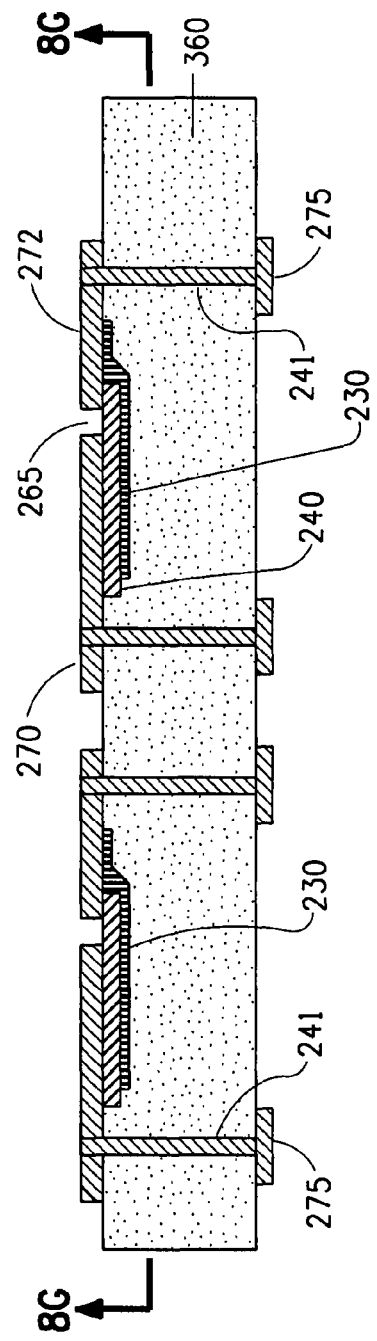

POWER CORE DEVICES AND METHODS OF MAKING THEREOF

This application claims the benefit of U.S. National patent application Ser. No. 11/514,094, filed on Aug. 31, 2006, which claimed the benefit of U.S. Provisional Patent No. 60/729,275, filed on Oct. 21, 2005.

FIELD OF THE INVENTION

The technical field relates to devices having both low inductance and high capacitance functions, and methods of incorporating such devices in power core packages, including organic dielectric laminates and printed wiring boards.

TECHNICAL BACKGROUND OF THE INVENTION

Since semiconductor devices including integrated circuits (IC) operate at increasingly higher frequencies and data rates and at lower voltages, the production of noise in the power and ground (return) lines and the need to supply sufficient current to accommodate faster circuit switching become an increasingly important problem. In order to provide low noise and stable power to the IC, low impedance in the power distribution system is required. In conventional circuits, impedance is reduced by the use of additional surface mount capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin; the IC will malfunction. Additionally, as the IC powers up, a slow response time will result in power overshoot. Power droop and overshoot must be controlled within allowable limits by the use of capacitors that are close enough to the IC to provide or absorb power within the appropriate response time.

Capacitors for impedance reduction and minimizing power droop or dampening overshoot are generally placed as close to the IC as possible to improve circuit performance. Conventional designs for capacitor placement mount capacitors on the surface of a printed wiring board (PWB) clustered around the IC. Large value capacitors are placed near the power supply, mid-range value capacitors at locations between the IC and the power supply, and small value capacitors very near the IC. This distribution of capacitors is designed to reduce voltage response time as power moves from the power supply to the IC.

FIG. 1 is a schematic for a typical placement of capacitors. Shown is a power supply, an IC and the capacitors 4, 6, 8, which represent high value, mid-range value and small value capacitors, respectively, used for impedance reduction and minimizing power droop and dampening overshoot as described above.

FIG. 2 is a representative section view in front elevation showing the connections of Surface Mount Technology (SMT) capacitors 50 and 60 and IC device 40 to the power and ground planes in the substrate of the PWB. IC device 40 is connected to lands 41 by solder filets 44. Lands 41 are connected to plated-through hole via pads 82 of vias 90 and 100 by circuit lines 72 and 73. Via 90 is electrically connected to conductor plane 120 and via 100 is connected to conductor plane 122. Conductor planes 120 and 122 are connected one to the power or voltage side of the power supply and the other to the ground or return side of the power supply. Small value capacitors 50 and 60 are similarly electrically connected to vias and conductor planes 120 and 122 in such a way that they are electrically connected to IC device 40 in parallel. In the case of IC devices placed on modules, interposers, or packages, the large and medium value capacitors may reside on the printed wiring mother board to which the modules, interposers, or packages are attached.

A large number of capacitors, interconnected in parallel, is often needed to reduce power system impedance. This requires complex electrical routing, which leads to increased circuit loop inductance. In turn this increases impedance, constraining current flow, thereby reducing the beneficial effects of surface mounted capacitors. As frequencies increase and operating voltages continue to drop, increased power must be supplied at faster rates requiring increasingly lower inductance and impedance levels.

Considerable effort has been expended to minimize impedance. U.S. Pat. No. 5,161,086 to Howard, et al., provides one approach to minimizing impedance and "noise". Howard, et al. discloses a capacitive printed circuit board with a capacitor laminate (planar capacitor) placed within the multiple layers of the laminated board with a large number of devices such as integrated circuits being mounted or formed on the board and operatively coupled with the capacitor laminate (or multiple capacitor laminates) to provide a capacitive function employing borrowed or shared capacitance. However, such an approach to capacitor placement does not provide for high capacitance and does not necessarily improve voltage response. Improved voltage response requires that the capacitor be placed closer to the IC. Moreover, simply placing the capacitor laminate closer to the IC is not a satisfactory technical solution to provide high capacitance because the total capacitance available may be insufficient.

U.S. Pat. No. 6,611,419 to Chakravorty discloses an alternate approach to embedding capacitors to reduce switching noise. The power supply terminals of an integrated circuit die can be coupled to the respective terminals of at least one embedded capacitor in a multilayer ceramic substrate.

Accordingly, the present inventors desired to provide a method of designing and making a power core that allows for impedance reduction combined with improved voltage response to accommodate higher IC switching speeds. The present invention provides such a device and method of making such a device.

SUMMARY

The present invention is directed to a power core device comprising a power core having an outer layer, said power core comprising at least one embedded singulated capacitor wherein said embedded singulated capacitor comprises at least a first embedded singulated capacitor electrode and a second embedded singulated capacitor electrode and wherein said embedded singulated capacitor is positioned on said outer layer of said power core and wherein said first embedded singulated capacitor electrode and said second embedded singulated capacitor electrode are directly connected to at least one Vcc (power) terminal and at least one Vss (ground) terminal, respectively, of a semiconductor device and wherein said first embedded singulated capacitor electrode and said second embedded singulated capacitor electrode are interconnected to a first external planar capacitor electrode and a second external planar capacitor electrode respectively of an external planar capacitor embedded within a printed wiring motherboard.

BRIEF DESCRIPTION OF THE DRAWINGS

The detailed description will refer to the following drawings, wherein like numerals refer to like elements, and wherein:

FIGS. 8A-8G illustrate a method of making singulated thin-film fired-on-foil capacitors and laminating them to a PWB core wherein the singulated capacitors are on the outer metal layer of the PWB.

DETAILED DESCRIPTION

Figure 1:
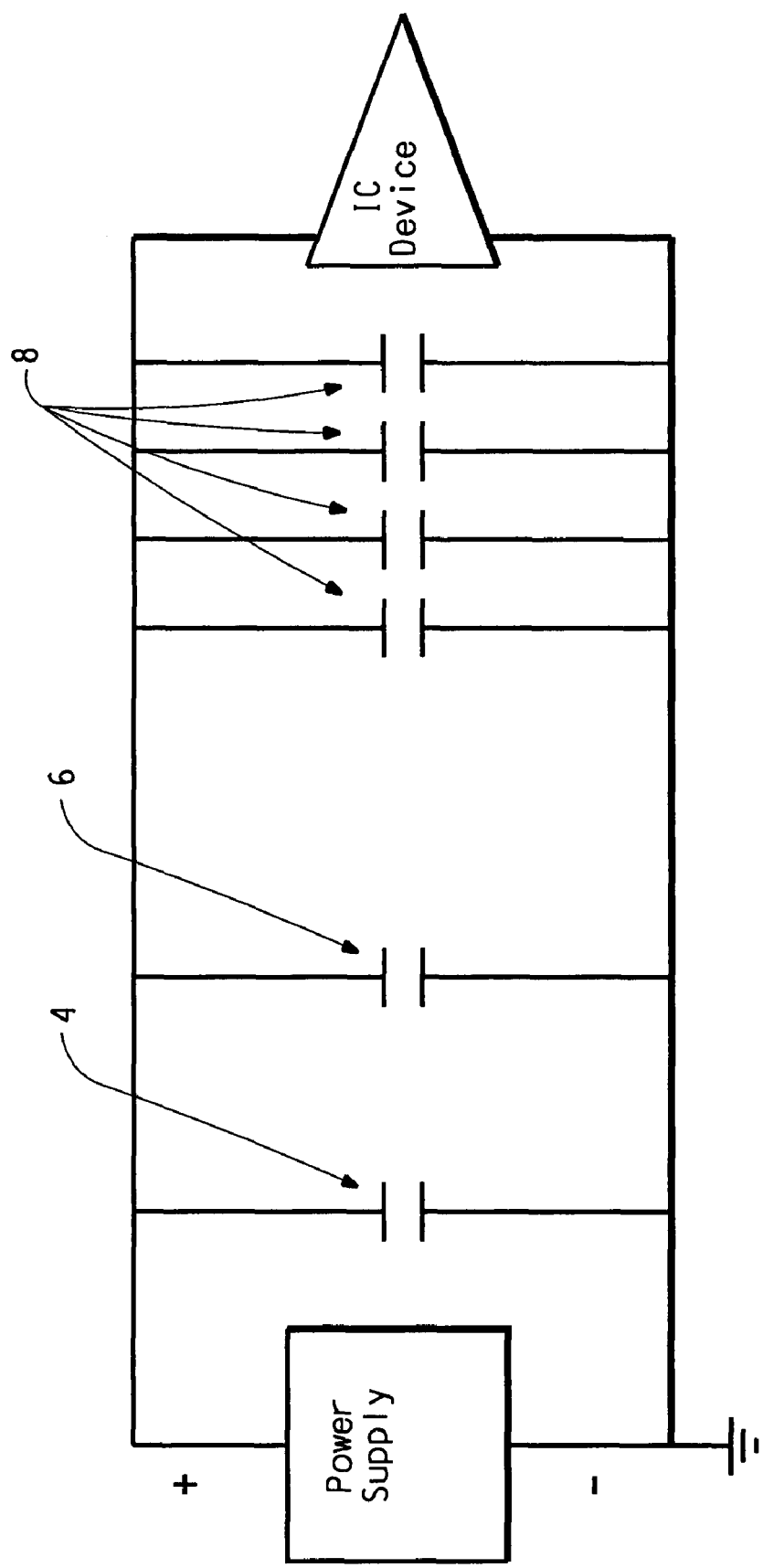
FIG. 1 is a schematic illustration of typical prior art use of capacitors for impedance reduction and reducing power droop or dampening overshoot.
Figure 2:
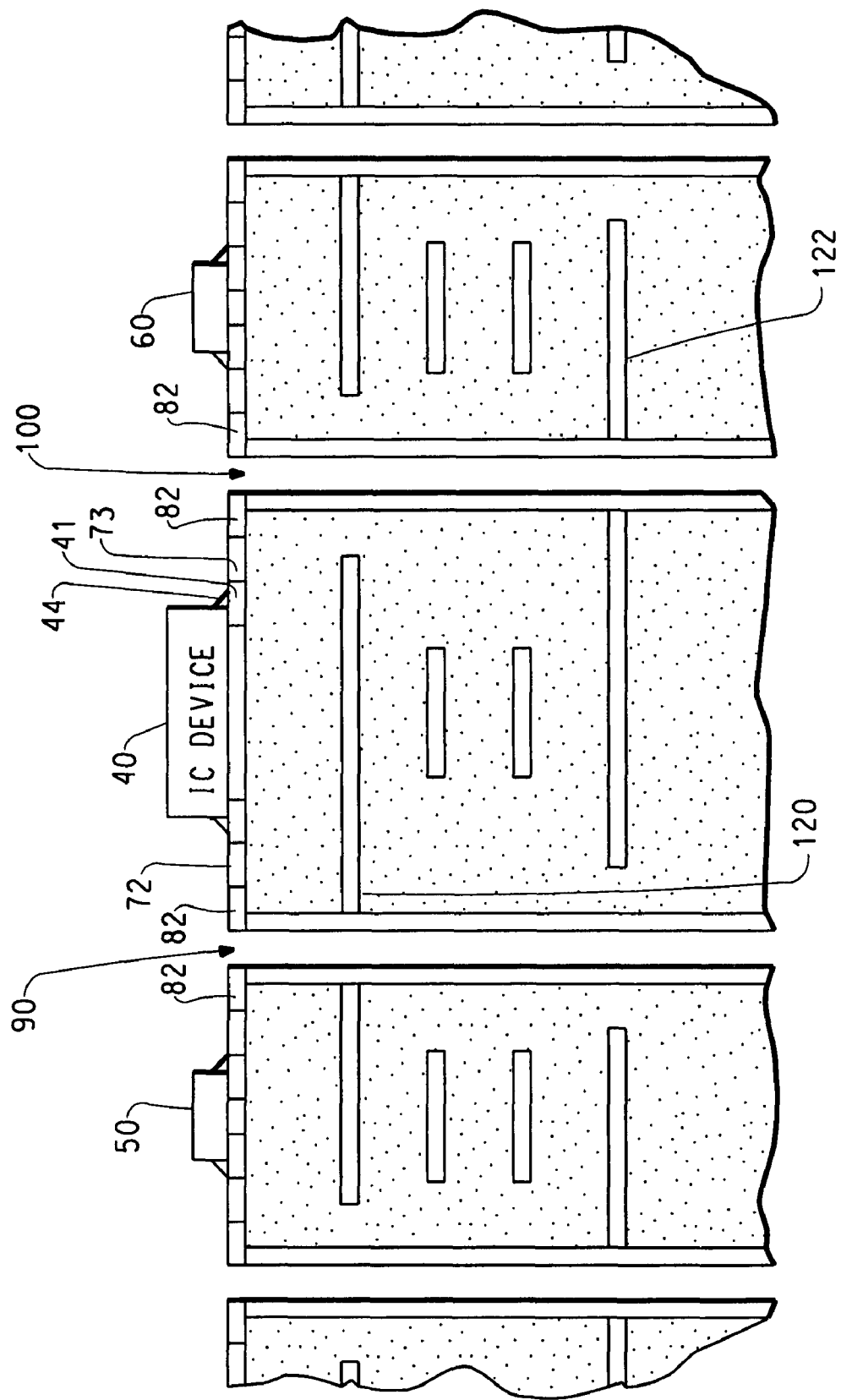
FIG. 2 is a representation in section view in front elevation of a printed wiring board assembly having conventional prior art surface mount (SMT) capacitors used for impedance reduction and reducing power droop or dampening overshoot.

As used herein, "fired-on-foil capacitors" refers to capacitors that is formed by firing a deposited dielectric layer on a metallic foil at an elevated temperature to crystallize and sinter the dielectric to form a high dielectric constant layer. A top electrode may be deposited before or after firing the dielectric to form the capacitor. The embedded singulated capacitors may be formed by other methods and are simply formed-on-foil. Typically, a firing process is used and therefore the term "fired-on-foil" is used in the Detailed Description, but it is not intended to be limiting.

As used herein, the term "printed wiring board (PWB) core" refers to a printed wiring board structure that is formed from at least one inner layer PWB laminate structure that comprises at least one prepreg/metal layer that may contain circuitry. A PWB core is typically used as the base for additional metal/dielectric layers that are built up or sequentially added to the core.

As used herein, the terms "high dielectric constant materials" or "high K, thin-film capacitor dielectric materials" refer to materials that have a bulk dielectric constant above 500 and can comprise perovskite-type ferroelectric compositions with the general formula $ABO_3$. Examples of such compositions include $BaTiO_3$; $BaSrTiO_3$; $PbTiO_3$; $PbTiZrO_3$; $BaZrO_3SrZrO_3$; and mixtures thereof. Other compositions are also possible by substitution of alternative elements into the A and/or B position, such as $Pb(Mg_{1/3}Nb_{2/3})O_3$ and $Pb(Zn_{1/3}Nb_{2/3})O_3$ and mixtures thereof. Mixed metal versions of the above compositions are also suitable.

As used herein, the term "printed wiring board", "PWB" or "printed wiring board device" refers to an interposer, multi-chip module, area array package, semiconductor package, system-on package, system-in-package, and the like or a device used as such.

As used herein, the term "printed wiring motherboard" refers to a large printed wiring board that the printed wiring board as defined above, is generally placed on and interconnected to. The printed wiring motherboard comprises at least one planar capacitor (i.e., the external planar capacitor) which serves as a planar capacitor external to the power core and which is interconnected to and supplies power to the embedded singulated capacitor(s) of the power core. The printed wiring motherboard planar capacitor comprises a first printed wiring motherboard planar capacitor electrode and a second printed wiring motherboard planar capacitor electrode. Motherboard, mother board, or printed wiring motherboard, as used herein, includes boards or cards.

As used herein, the term "semiconductor device" includes microprocessors, processors, graphic processors, memory controllers, input/output controllers, ASICs, gate arrays and devices performing similar functions. A semiconductor device comprises at least one Vcc (power) terminal and at least one Vss (ground) terminal.

As used herein, the term "power core" comprises at least one embedded singulated capacitor wherein said power core has an outer layer. The outer layer of the power core refers to the outer most surface of the power core placed in closest proximity to the semiconductor device.

As used herein, the term "planar capacitor" refers to a foil/dielectric/foil laminate capacitor structure wherein both foils are common electrodes.

As used herein, "singulated capacitors" refers to individual capacitors formed on metal foil. Multiple singulated capacitors may or may not have one common electrode.

As used herein, the term "foil" encompasses a general metal layer, plated metal, sputtered metal, etc.

According to a first embodiment, a design of a power core device is disclosed in which electrodes of singulated capacitors on the outer layer of a power core are connected in parallel to the electrodes of a planar capacitor external to the power core and in a printed wiring motherboard.

The singulated capacitors in the power core structure are designed to be on the outer layer of the device so that the Vcc (power) terminals and the Vss (ground) terminals of the semiconductor device, such as a microprocessor, are aligned with and may be connected directly to the first and second electrodes of the singulated capacitor. The second electrodes of the singulated capacitors may be common or may be separated. Placing the singulated capacitors on the outer layer also provides for low inductance connections.

The first and second electrode of the singulated capacitors are in turn connected to the power and ground planes respectively of the external planar capacitor embedded in the printed wiring motherboard. The planar capacitor is used as the power-ground planes and the power-ground plane separation is made thin to maximize capacitance density to provide rapid charging of the singulated capacitors. The mother board is quite large relative to the PWB within which the singulated capacitors reside so that the planar capacitor is large, thus having the ability to supply considerable power to the singulated capacitors.

Figure 3:
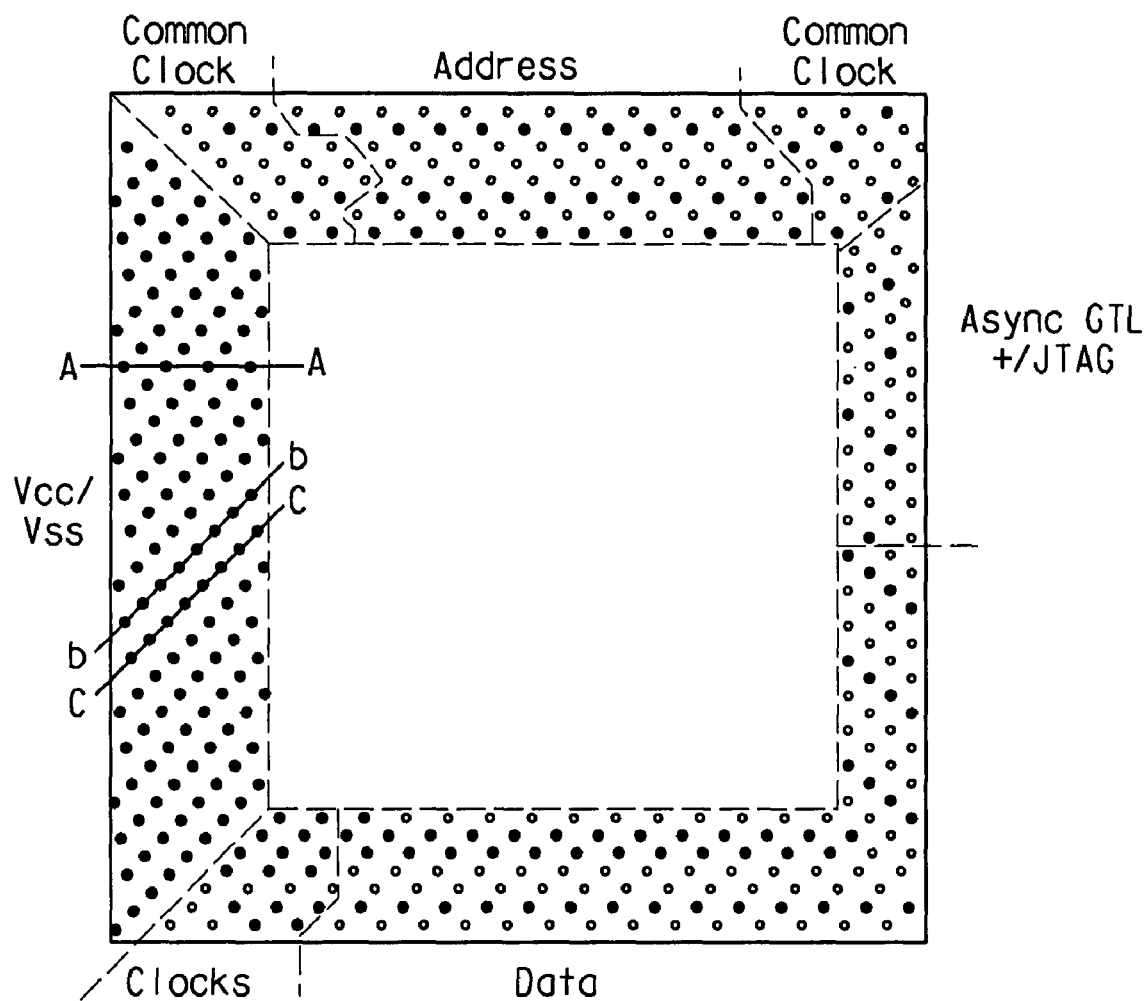
FIG. 3 shows the typical arrangement of Vcc (power) and Vss (ground) connections of the layout of a BGA assembly, such as a Pentium® 4 processor package.

FIG. 3 shows the typical mechanical arrangement of Vcc (power) and Vss (ground) connections to the printed wiring board for a BGA assembly, such as a Pentium 4® processor package. The Vcc/Vss terminals are the area of focus for the power core.

Figure 4:
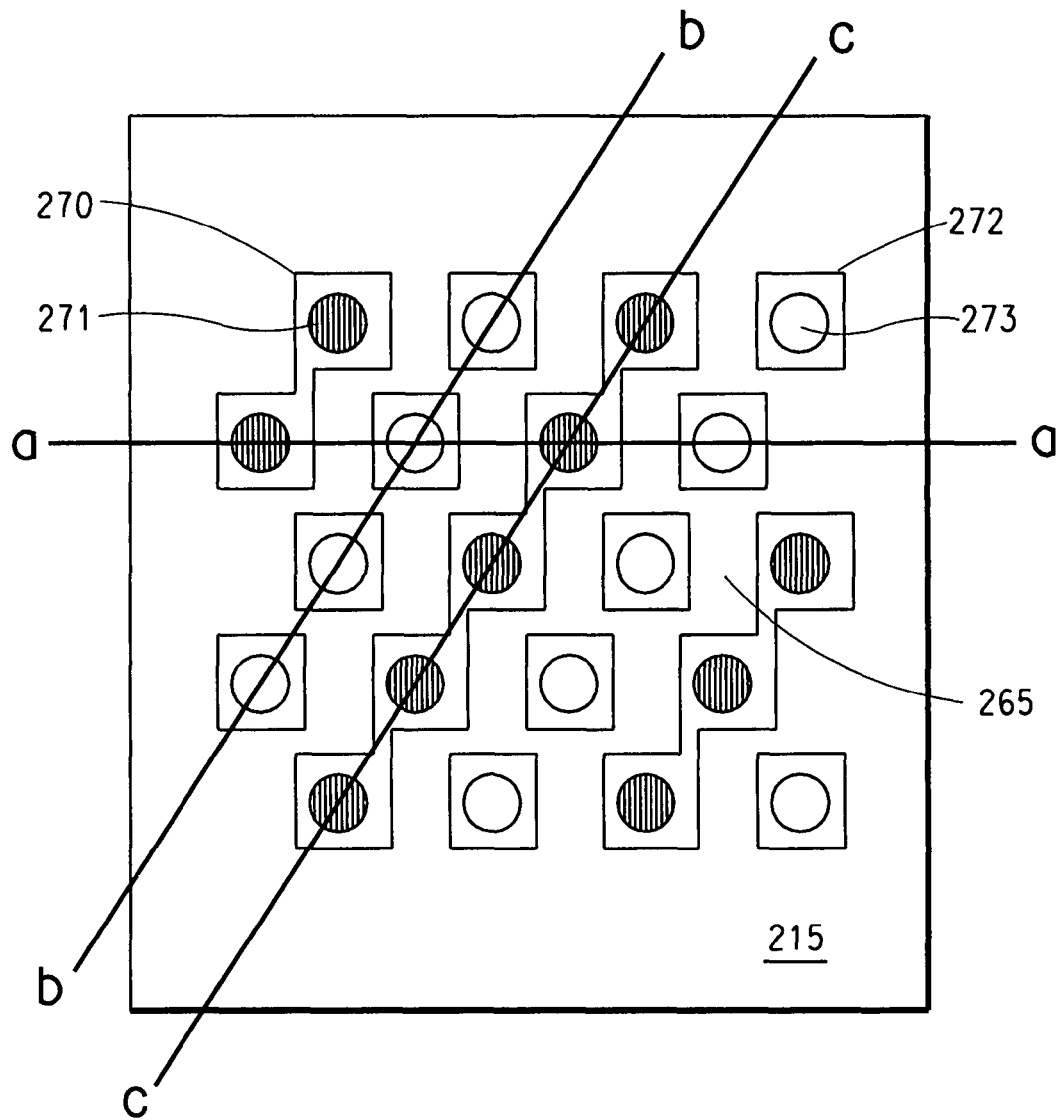
FIG. 4 is a plan view of a portion of the power core device according to the first embodiment showing how electrode pads of the singulated capacitors are aligned to the layout shown in FIG. 3.

FIG. 4 shows a top plan view of the relevant portion of the power core device according to the present embodiment. Both the first electrode 272 and second electrode 270 of the singulated capacitors are outlined in FIG. 4. Electrodes 272 and 270 are separated by a trench 265 formed in the underlying metal foil and are present on the surface of the power core device. The first electrodes 272, are designed to be connected directly to the Vcc (power) terminals of the processor package. The second electrodes 270 are designed to be connected directly to the Vss (ground) terminals of the processor package and are common. The size of the electrode pads 273 and 271 are defined by soldermask 215 shown on the surface of the power core device.

Figure 5:
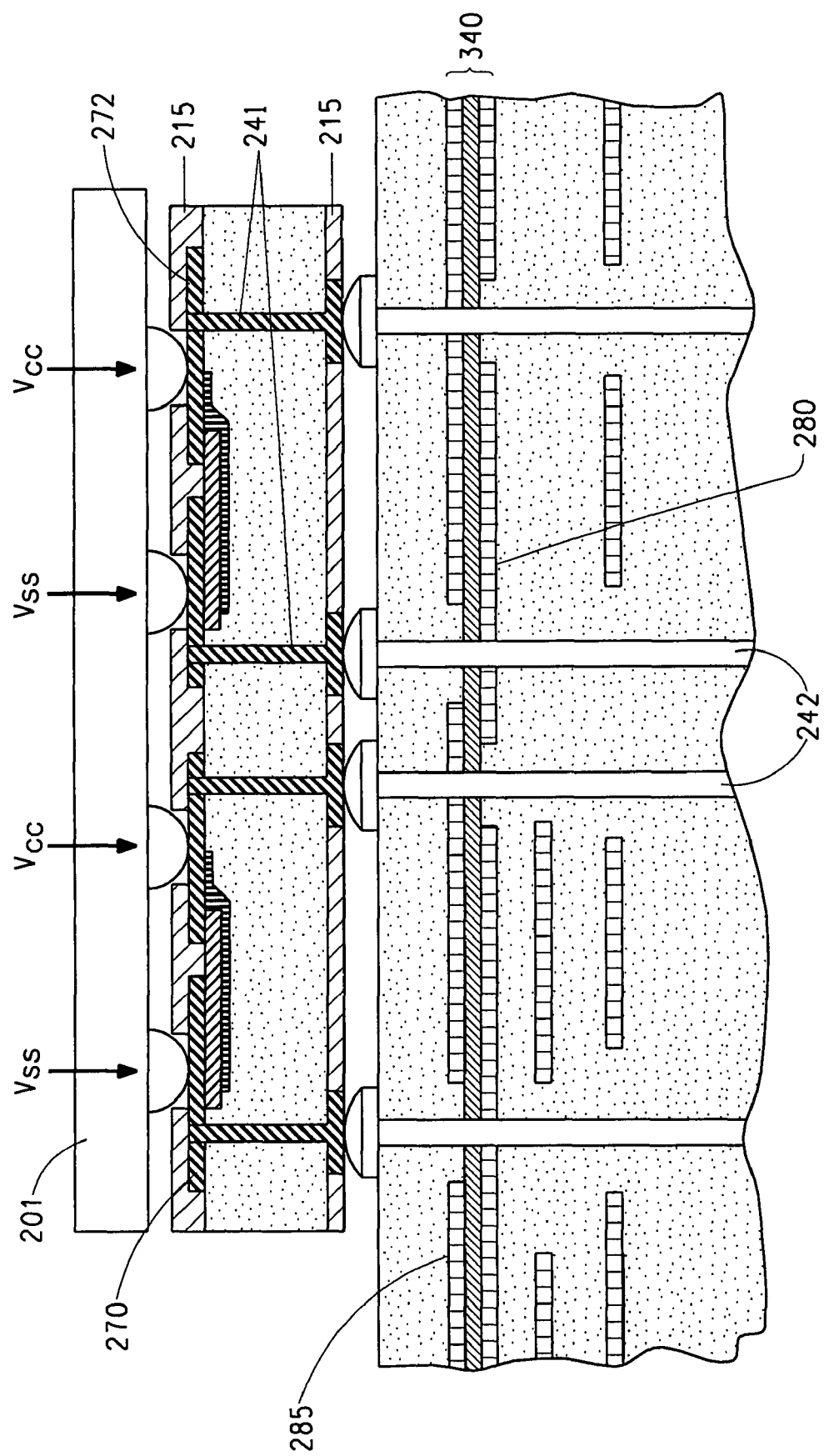
FIG. 5 is a representation in section view across line a-a of FIG. 4 in front elevation of a portion of a power core device according to the first embodiment wherein the electrodes of the capacitor on the outer layer have been connected in parallel to the electrodes of the planar capacitor laminate within the printed wiring motherboard.
Figure 6:
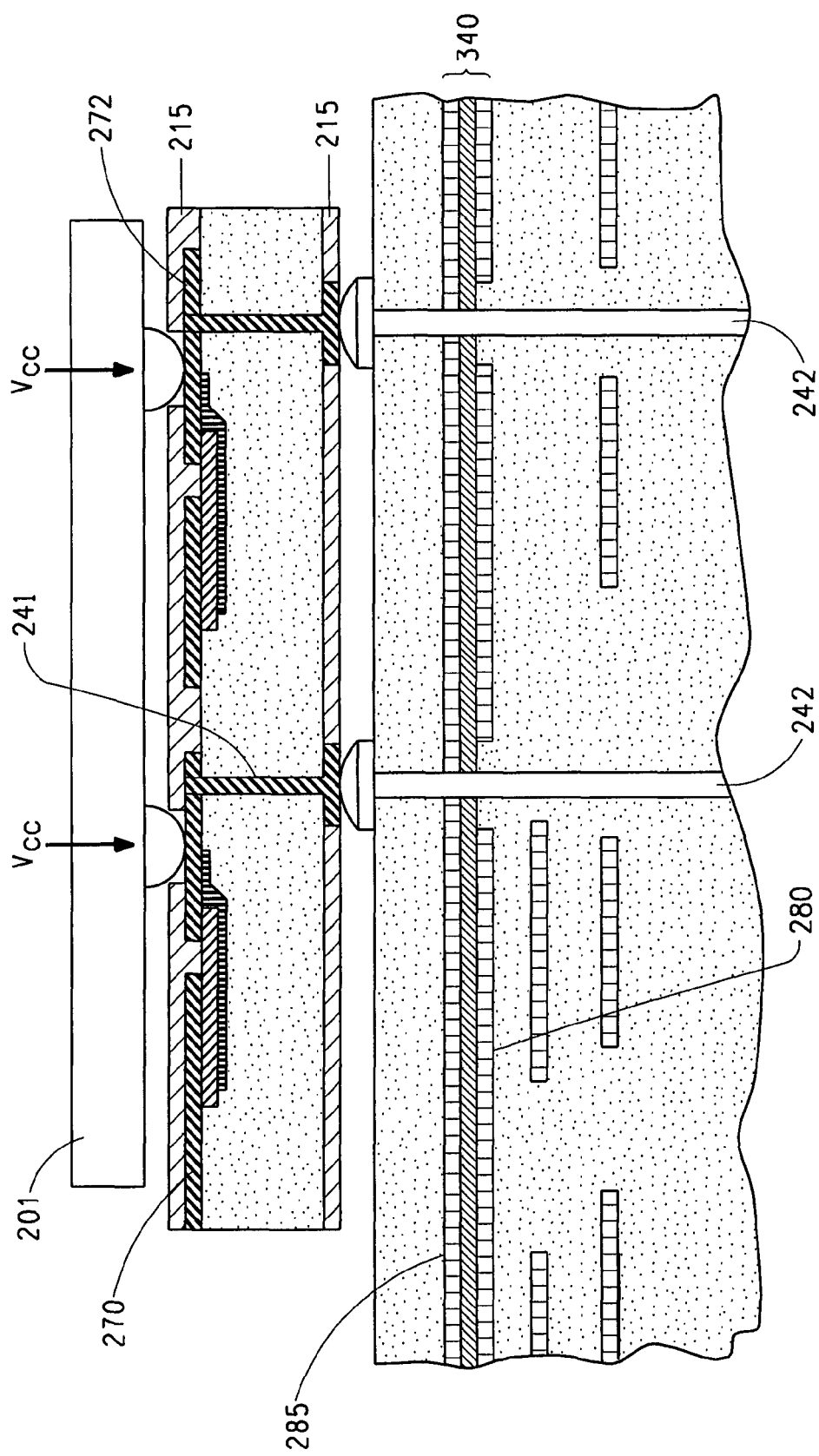
FIG. 6 is a representation in section view across line b-b of FIG. 4 in front elevation of a portion of a power core device according to the first embodiment wherein the electrodes of the capacitor on the outer layer have been connected in parallel to the electrodes of the planar capacitor laminate within the printed wiring motherboard.
Figure 7:
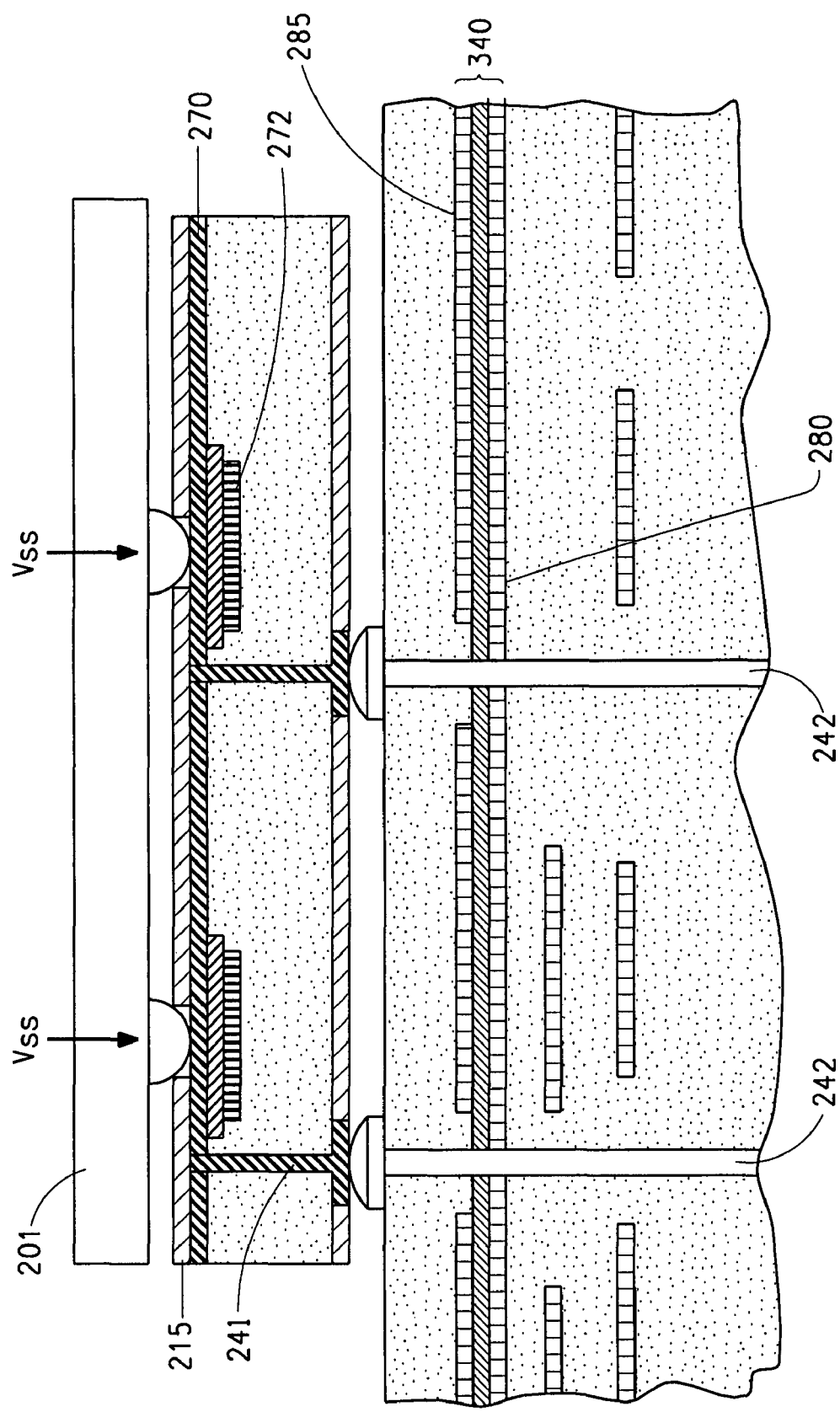
FIG. 7 is a representation in section view across line c-c of FIG. 4 in front elevation of a portion of a power core device according to the first embodiment wherein the electrodes of the capacitor on the outer layer have been connected in parallel to the electrodes of the planar capacitor laminate within the printed wiring motherboard.

FIGS. 5-7 are representations in section view in front elevation of the top portion of a power core structure along lines a-a, b-b, and c-c of FIG. 4 respectively. FIG. 5 is a partial representation in section view across line a-a in front elevation of a power core device with an attached semiconductor device, such as a microprocessor, interconnected with a planar capacitor within a printed wiring motherboard, according to the first embodiment. The Vcc (power) terminals of the semiconductor device 201 are connected to the soldermask (215) defined pads 273 (shown in FIG. 4) of the first electrodes 272 of the singulated capacitor which in turn are connected to the power plane 285 of the planar capacitor 340 within the printed wiring motherboard by microvias 241 in the power core and vias 242 in the printed wiring motherboard. The Vss (ground) terminals of the semiconductor device 201 are connected to the soldermask (215) defined pads 271 (shown in FIG. 4) of the second electrodes 270 of the singulated capacitor which in turn are connected to the ground plane 280 of the planar capacitor 340 within the printed wiring motherboard. FIG. 6 is a partial representation in section view across line b-b in front elevation of a power core device with an attached semiconductor device, interconnected with a planar capacitor within a printed wiring motherboard, according to the first embodiment. The Vcc (power) terminals of the microprocessor 201 are connected to the soldermask (215) defined pads 231 (shown in FIG. 4) of the first electrodes 272 of the singulated capacitor which in turn are connected to the power plane 285 of the planar capacitor 340 within the printed wiring motherboard by microvias 241 in the power core and vias 242 in the printed wiring motherboard. FIG. 7 is a partial representation in section view across line c-c in front elevation of a power core device with an attached microprocessor, interconnected with a planar capacitor within a printed wiring motherboard, according to a first embodiment. The Vss (ground) terminals of the semiconductor device 201 are connected to the soldermask (215) defined pads 271 (shown in FIG. 4) of the common second electrode 270 of the singulated capacitors which in turn is connected to the ground plane 280 of the planar capacitor 340 within the printed wiring motherboard by microvias 241 in the power core and vias 242 in the printed wiring motherboard.

The above power core allows for a foil containing the singulated capacitors to be formed with various materials. In general, fired-on-foil techniques may be preferably employed to make singulated ceramic capacitors on foil using ceramic compositions that are fired at relatively high temperatures (typically, 700° C. to 1400° C.) to form a sintered ceramic capacitor. Such capacitors may be formed from thin-film or thick-film approaches. The foil containing said fired-on-foil capacitors may be laminated to the PWB core using standard printed wiring board lamination processes to form the power core structure.

The above power core is interconnected to the planar capacitor embedded within the printed wiring motherboard. The printed wiring motherboard is generally considerably larger than the PWB containing the singulated capacitors and hence the planar capacitor may be made large in area thereby, supporting more and improved power supply to the singulated capacitors.

The planar capacitor may be formed using various materials. Such materials may include metal foil-dielectric-metal foil laminate structures wherein the dielectric may comprise an organic layer, a ceramic-filled organic layer, or a ceramic layer. Multiple planar capacitor layers may also be used. Such dielectrics would be manufactured as thin layers, for example, between 4 microns and 25 microns, for improved capacitance density. Planar capacitors will generally reside in the upper and lower layers of the printed wiring motherboard for symmetry. Suitable planar capacitor laminates include Interra™ HK 04 Series commercially available from E. I. du Pont de Nemours and Company, Interra™ HK 11 Series commercially available from E. I. du Pont de Nemours and Company, BC-2000 and BC-1000 commercially available from laminators licensed by Sanmina, FaradFlex Series commercially available from Oak-Mitsui Technologies, InSite™ Embedded Capacitor Series commercially available from Rohm and Haas Electronic Materials, TCC™ commercially available from Gould Electronics, and C-Ply from 3M.

According to the above embodiment, both the low impedance and high capacitance functions may be integrated into a single power core structure permitting operation of high-speed ICs at lower voltages with reduced voltage ripple. Further, the planar capacitor within the printed wiring motherboard, supplying power to the singulated capacitor, may be large relative to the PWB containing the singulated capacitors. Furthermore, solder joints associated with SMT devices may be eliminated, thereby improving reliability.

According to common practice, the various features of the drawings are not necessarily drawn to scale. Dimensions of various features may be expanded or reduced to more clearly illustrate the embodiments of the invention.

Figure 8A:
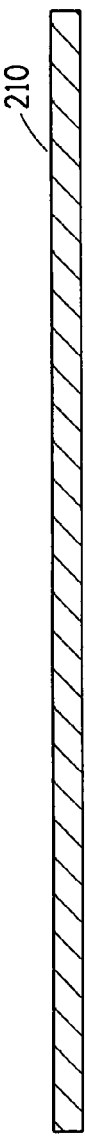
Figure 8B:
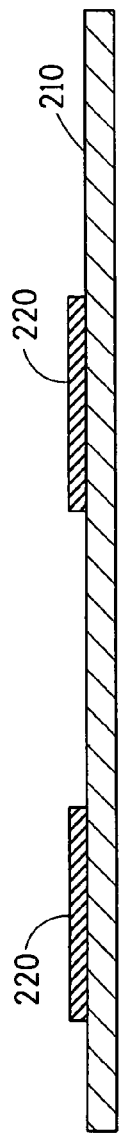
Figure 8C:
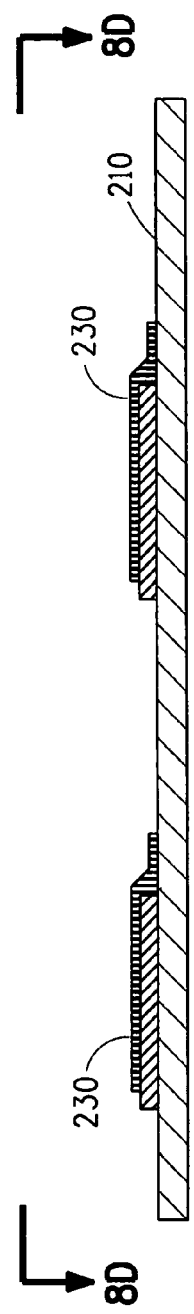
Figure 8D:
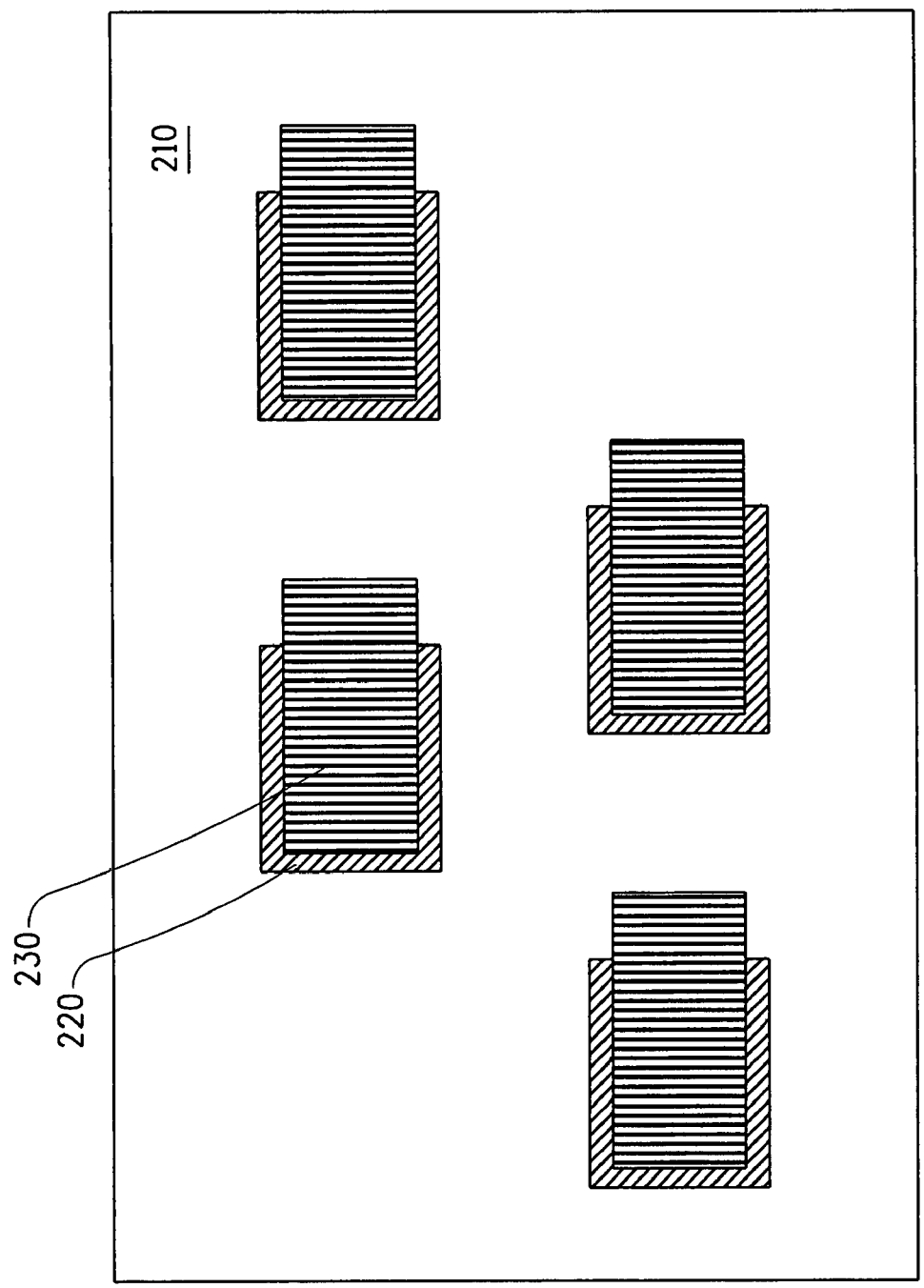
Figure 8G:
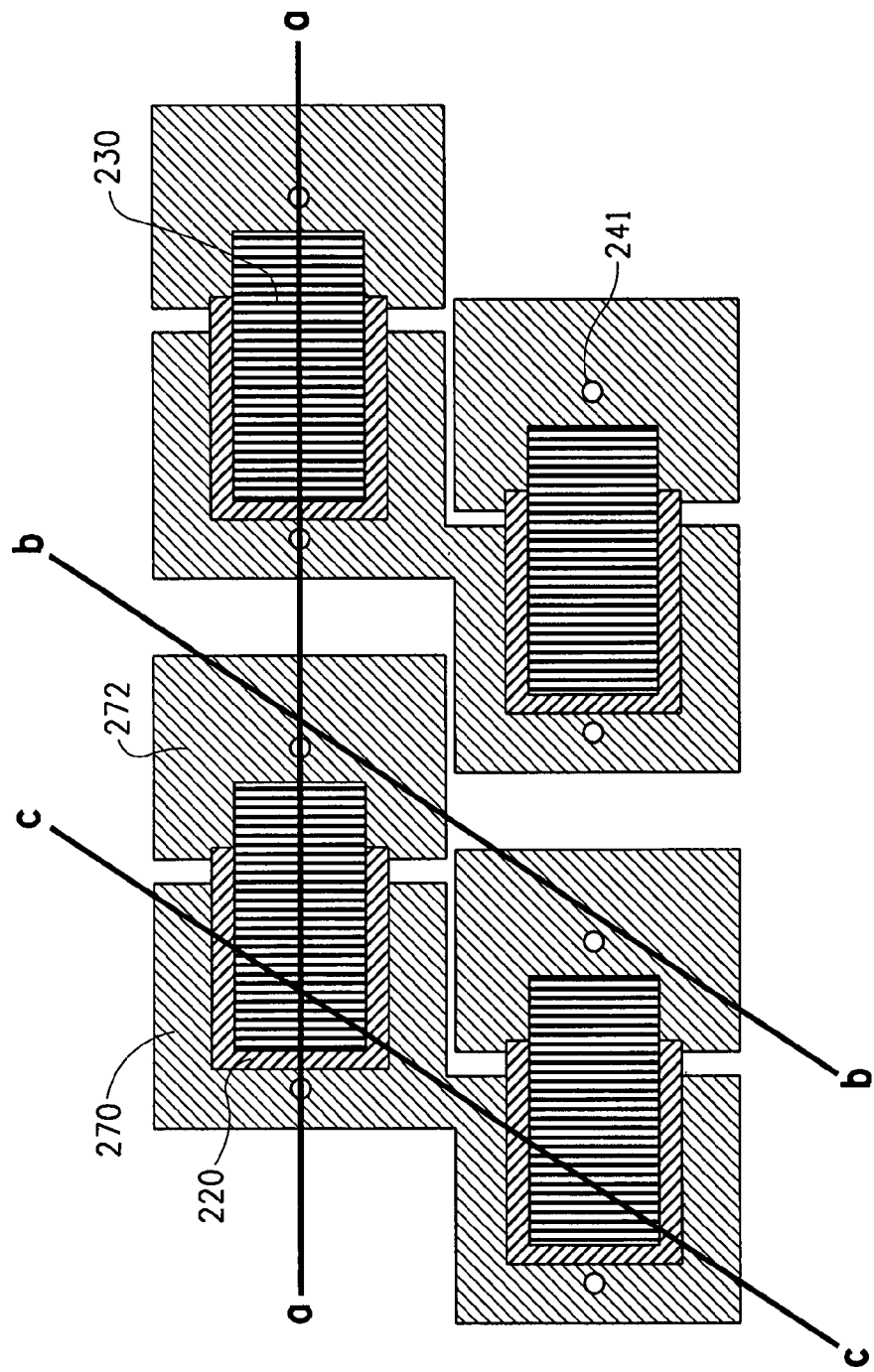

FIGS. 8A-8G illustrate a method of manufacturing fired-on-foil singulated capacitors and laminating them to a PWB core structure. FIG. 8D is a plan view of fired-on-foil capacitors. FIG. 8G is a plan view of the singulated capacitors after etching of the foil viewed from beneath and within the PWB. The lines a-a, b-b, and c-c from FIGS. 3 and 4 are shown on the plan view of FIG. 8G to illustrate the capacitor layout. FIGS. 8A-8G illustrate a method wherein the dielectric is selectively deposited on to a metallic foil in desired areas only. Alternative designs of the power core may include forming said singulated capacitors from alternative approaches. For example, the dielectric may be deposited over the entirety of the metallic foil and top electrodes deposited over the dielectric to form a series of parallel plate singulated capacitors. Such an approach would require different etching patterning and via formation approaches to connect the terminals of the semiconductor device to the respective electrodes. The electrodes would be connected with the respective planar capacitor planes in the mother board by vias in the same manner. Alternative methods, such as this, may achieve the same design requirements.

A specific example of fired-on-foil capacitors are described below to illustrate one embodiment of the present invention.

FIG. 8A is a side elevational view of a first stage of manufacturing singulated capacitors. In FIG. 8A, a metallic foil 210 is provided. The foil 210 may be of a type generally available in the industry. For example, the foil 210 may be copper, copper-invar-copper, invar, nickel, nickel-coated copper, or other metals that have melting points in excess of the firing temperature for the dielectric. Preferred foils include foils comprised predominantly of copper or nickel. The thickness of the foil 210 may be in the range of, for example, about 1-100 microns, preferably 3-75 microns, and most preferably 12-36 microns, corresponding to between about ⅓ oz and 1 oz copper foil. An example of a suitable copper foil is PLSP grade 1 ounce copper foil obtainable from Oak-Mitsui. An example of a suitable nickel foil is Nickel Foil 201 obtainable from Allfoils.

In FIG. 8B, a capacitor dielectric material is deposited onto the metal foil 210, forming capacitor dielectric layer 220. The capacitor dielectric material may be deposited, for example, by sputtering a suitable high dielectric constant material through a mask to define the dielectric area. Other deposition methods include coating the desired areas of the foil using a chemical solution of a high dielectric constant material. Other methods may be appropriate.

High dielectric constant, (high K) materials may be described as materials that have bulk dielectric constant above 500 and can comprise perovskite-type ferroelectric compositions with the general formula $ABO_3$. Examples of such compositions include, but not limited to $BaTiO_3$; $SrTiO_3$; $PbTiO_3$; $PbTiZrO_3$; $BaZrO_3$ $SrZrO_3$; and mixtures thereof. Other compositions are also possible by substitution of alternative elements into the A and/or B position, such as $Pb(Mg_{1/3}Nb_{2/3})O_3$ and $Pb(Zn_{1/3}Nb_{2/3})O_3$ and mixtures thereof. A suitable high K material is barium titanate ($BaTiO_3$). Doped and mixed metal versions of the above compositions are also suitable. Doping and mixing is done primarily to achieve the necessary end-use property specifications such as, for example, the necessary temperature coefficient of capacitance (TCC) in order for the material to meet industry definitions, such as "X7R" or "Z5U" standards.

The capacitor dielectric layer 220 is then fired. The firing temperature may be in the range of 700° C. to 1400° C. The firing temperature depends on the melting point of the underlying metallic foil and the microstructural development desired in the dielectric. For example, a suitable upper firing temperature for copper is approximately 1050° C. but for nickel, it can be as high as 1400° C., due to their melting points. During firing, the dielectric crystallizes in the temperature range of 500-700° C. and further heating densifies the dielectric and promotes grain growth. Firing is done under a protective or reducing atmosphere sufficiently low in oxygen to afford oxidation protection to the metal foil. The exact atmosphere chosen will depend upon the temperature and the underlying metallic foil. Such protective atmospheres can be thermodynamically derived from standard free energy of formation of oxides as a function of temperature calculations or diagrams as disclosed in publication "F. D. Richardson and J. H. E. Jeffes, J. Iron Steel Inst., 160, 261 (1948). For example, using copper as the underlying metallic foil, firing at 700° C., 900° C. and 1050° C. would require partial pressures of oxygen ($PO_2$) of approximately less than $4\times10^{-11}$, $3.7\times10^{-8}$, and $1.6\times10^{-6}$ atmospheres respectively to protect the copper from oxidation.

In FIG. 8C, an electrode 230 is formed over the dielectric layer 220. The electrode 230 can be formed by, for example, sputtering but other methods are possible. In general, the surface area of the dielectric layer 220 should be larger than that of the electrode 230. The electrode 230 is typically deposited after the dielectric has been fired. In some cases, however, it may be deposited prior to firing of the dielectric.

FIG. 8D is a plan view of the article of FIG. 8C. In FIG. 8D, four dielectric layers 220 and four electrodes 230 on the foil 210 are illustrated. Any number dielectric layers 220 and electrodes 230, in various patterns consistent with the power and ground terminals of the semiconductor device, however, can be arranged on the foil 210.

The capacitor-on-foil structure may be inverted and the component face of the foil containing dielectric layers 220 and electrode layers 230 laminated to a PWB core comprising prepreg 360 and metal foil 310 to form the power core structure shown in FIG. 8E. The lamination can be performed, for example, using FR4 epoxy prepreg in standard printing wiring board processes. In one embodiment, epoxy prepreg Type 106 may be used. Suitable lamination conditions may be 185° C. at 208 psig for 1 hour in a vacuum chamber evacuated to 28 inches of mercury. A silicone rubber press pad and a smooth PTFE filled glass release sheet may be in contact with the foils 210 and 310 to prevent the epoxy from gluing the lamination plates together. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide electrical insulation. A release sheet may be in contact with the foils to prevent the epoxy from gluing the lamination plates together between circuit layers. The resulting structure is encapsulated by foil 210 on one side and foil 310 on the other.

Referring to FIG. 8F, after lamination, a photo-resist is applied to foils 210 and 310 (as shown in FIG. 8E). The photo-resist is imaged, developed and the metal foils are etched and the photoresist is stripped using standard printing wiring board processing conditions. The etching produces a trench 265 in the foil 210, which breaks electrical contact between the first electrode 230 and the foil 210 creating two surface electrodes 270 and 272 from foil 210. Microvias 241 are also drilled and plated at this time. Any associated circuitry is also created from foil 210 that may be used as signal or power distribution circuitry. The etching also produces pads 275 and any associated circuitry from foil 310.

FIG. 8G is a plan view of the singulated capacitors after etching of the foil. FIG. 8G is viewed from beneath and within the PWB of FIG. 8F. The lines a-a, b-b, and c-c from FIGS. 3 and 4 are shown on the plan to illustrate the layout of dielectric layers 220 and electrodes 270 and 272 and microvias 241 with respect to the microprocessor terminals.

Figure 9:
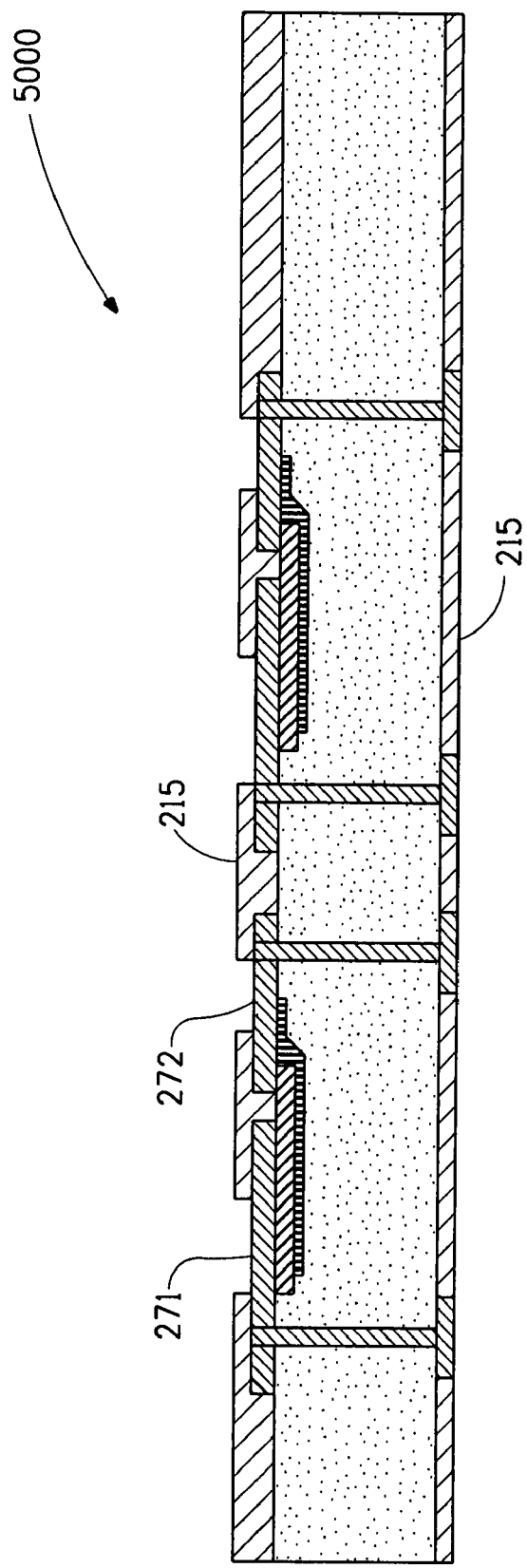
FIG. 9 is a representation in section view in front elevation of a finished power core structure according to the method of FIG. 8-8G wherein the singulated capacitors are on the outer metal layer of the power core device and have been interconnected by microvias to pads on the bottom surface of the power core device.

FIG. 9 represents a section view in front elevation after soldermask 215 has been added to the article shown in FIG. 8F to form the photomask defined pads 271 and 272 of the final embodiment of power core 5000.

The power core structure 5000 may be interconnected to at least one signal layer. The power core structure, therefore, may also have signal connection pads on its surface aligned with the semiconductor device signal terminals.

It should be understood that the power core 5000 may include additional layers and circuitry and may be formed by other sequences such as a combination of lamination and build-up processes.

The power core device of the present invention comprise a power core structure that is interconnected through at least one signal layer. The device may comprise more than one signal layer wherein the signal layers are connect through conductive vias.

Examples of vertical interconnects (via-fill, printed, etched, plated bumps) where layers are built individually and then laminated in one step may be utilized in the present invention.

What is claimed is:

1. A printed wiring board device comprising a power core having an outer layer, said power core comprising at least one embedded singulated capacitor layer containing multiple embedded singulated capacitors wherein said multiple embedded singulated capacitors each comprise at least a first embedded singulated capacitor electrode and a second embedded singulated capacitor electrode and wherein said multiple embedded singulated capacitors are positioned on said outer layer of said power core and wherein said first embedded singulated capacitor electrodes and said second embedded singulated capacitor electrodes of said multiple embedded singulated capacitors of said at least one embedded singulated capacitor layer are each directly connected to at least one Vcc (power) terminal and at least one Vss (ground) terminal, respectively, of a semiconductor device and wherein said first embedded singulated capacitor electrodes and said second embedded singulated capacitor electrodes of said multiple embedded singulated capacitors of said at least one embedded singulated capacitor layer are each interconnected to a first external planar capacitor electrode and a second external planar capacitor electrode, respectively, of an external planar capacitor embedded within a printed wiring motherboard on which said power core is placed and wherein said printed wiring motherboard serves to supply a charge to said multiple embedded singulated capacitors.

2. The printed wiring board device of claim 1 wherein said semiconductor device is a microprocessor.

3. The printed wiring board device of claim 1 wherein said power core is interconnected to at least one signal layer.

4. The printed wiring board device of any one of claims 1 through 3 wherein additional passive components are connected to and external to said power core.

5. The printed wiring board of claim 1 wherein the multiple embedded singulated capacitors of said at least one embedded singulated capacitor layer are each fired-on-foil ceramic capacitors.

6. A printed wiring board device comprising a power core having an outer layer, said power core comprising at least one embedded singulated capacitor layer containing multiple embedded singulated capacitors wherein said multiple embedded singulated capacitors each comprise at least a first embedded singulated capacitor electrode and a second embedded singulated capacitor electrode and wherein said multiple embedded singulated capacitors are positioned on said outer layer of said power core and wherein said first embedded singulated capacitor electrodes and said second embedded singulated capacitor electrodes of said multiple embedded singulated capacitors of said at least one embedded singulated capacitor layer are each directly connected to at least one Vcc (power) terminal and at least one Vss (ground) terminal, respectively, of a semiconductor device, and wherein said first embedded singulated capacitor electrodes and said second embedded singulated capacitor electrodes of said multiple embedded singulated capacitors of said at least one embedded singulated capacitor layer are each interconnected to a first external planar capacitor electrode and a second external planar capacitor electrode, respectively, of an external planar capacitor embedded within a printed wiring motherboard on which said power core is placed, and wherein said printed wiring motherboard serves to supply a charge to said multiple embedded singulated capacitors, and wherein the printed wiring board device has a smaller area than the external planar capacitor to which the multiple embedded singulated capacitors of said at least one embedded singulated capacitor layer are each interconnected.

* * * * *